(12) United States Patent
Kannou

(10) Patent No.: US 8,034,653 B2
(45) Date of Patent: Oct. 11, 2011

(54) METHOD AND APPARATUS FOR BREAKING SEMICONDUCTOR SUBSTRATE, METHOD FOR BREAKING SOLAR CELL AND METHOD FOR FABRICATION OF SOLAR CELL MODULE

(75) Inventor: Hiroyuki Kannou, Izumisano (JP)

(73) Assignee: Sanyo Electric Co., Ltd., Osaka (JP)

( * ) Notice: Subject to any disclaimer, the term of this patent is extended or adjusted under 35 U.S.C. 154(b) by 60 days.

(21) Appl. No.: 11/964,405

(22) Filed: Dec. 26, 2007

(65) Prior Publication Data
US 2008/0213979 A1    Sep. 4, 2008

(30) Foreign Application Priority Data
Dec. 26, 2006  (JP) ................... 2006-348789

(51) Int. Cl.
*H01L 21/00* (2006.01)
*B26F 3/00* (2006.01)
*B65H 35/00* (2006.01)

(52) U.S. Cl. .......... 438/68; 438/462; 438/463; 438/464; 438/465; 225/96.5; 225/103

(58) Field of Classification Search .......... 136/243–262; 225/93, 97, 103; 438/462–465, 68
See application file for complete search history.

(56) References Cited

U.S. PATENT DOCUMENTS

| | | | |
|---|---|---|---|
| 4,775,085 A | 10/1988 | Ishizuka et al. | |
| 6,962,279 B1 * | 11/2005 | Marek et al. | 225/93 |
| 2005/0196899 A1 | 9/2005 | Shimizu et al. | |
| 2005/0259459 A1 | 11/2005 | Nagai et al. | |
| 2007/0261731 A1 * | 11/2007 | Abe et al. | 136/244 |

FOREIGN PATENT DOCUMENTS

| | | |
|---|---|---|
| JP | 62-105446 A | 5/1987 |
| JP | 1-178408 A | 7/1989 |
| JP | 2-127003 | 5/1990 |
| JP | 2-179708 A | 7/1990 |
| JP | 9-148601 A | 6/1997 |
| JP | 2003-286044 A | 10/2003 |
| JP | 2004-031839 | 1/2004 |
| JP | 2005-79526 A | 3/2005 |
| JP | 2005-236017 | 9/2005 |
| JP | 2006-253417 A | 9/2006 |
| WO | WO 2004/081992 A2 | 9/2004 |

OTHER PUBLICATIONS

Extended European Search Report for corresponding EP Application No. 07025018.8-1528, dated Oct. 14, 2010, pp. 1-7.

* cited by examiner

*Primary Examiner* — Ha Tran T Nguyen
*Assistant Examiner* — Aaron Dehne
(74) *Attorney, Agent, or Firm* — Ditthavong Mori & Steiner, P.C.

(57) ABSTRACT

A method and apparatus for breaking a semiconductor substrate along a predetermined area over which a split groove is formed. The breaking apparatus includes a table for placing a portion of the semiconductor substrate inside the predetermined area and a breaking blade being operable to move downward from a position above the semiconductor substrate placed on the table to thereby compress a portion of the semiconductor substrate outside the predetermined area so that the semiconductor substrate is broken along the split groove. The predetermined area of the semiconductor substrate has at least a neighboring pair of sides intersecting at an angle of less than 180 degrees, and the breaking blade has a projection which, when the semiconductor substrate is broken, compresses a portion of the semiconductor substrate outside the one side so that the one side is compressed ahead of the other side.

15 Claims, 7 Drawing Sheets

__(1)__

METHOD AND APPARATUS FOR BREAKING SEMICONDUCTOR SUBSTRATE, METHOD FOR BREAKING SOLAR CELL AND METHOD FOR FABRICATION OF SOLAR CELL MODULE

BACKGROUND OF THE INVENTION

1. Technical Field

The present invention relates to a method and apparatus for breaking a semiconductor substrate, made by forming a photovoltaic element or other element structure on a silicon wafer or the like, along a predetermined region over which a split groove is formed, a method for breaking a solar cell utilizing the above method and apparatus, and a method for fabrication of a solar cell module.

2. Description of Related Art

It has been conventionally studied to divide a solar cell comprising a large-area semiconductor substrate into small-area solar cells and connect them as by lead wires to thereby fabricate a solar cell module.

In Japanese Patent Laid-Open Nos. 2005-236017 and 2004-31839, methods are disclosed for fabricating a solar cell by forming a split groove on a semiconductor substrate using a laser or a dicing saw and dividing the substrate utilizing the split groove. In the case where a semiconductor substrate is broken along a predetermined area over which a split groove is formed, a method is generally used wherein, while a portion of the semiconductor substrate inside a predetermined area is held in position, its portion outside the predetermined area is pressed downward so that the semiconductor substrate is broken along the split groove. In this case, breaking is achieved by simultaneously applying a pressing force to the entire portion of the semiconductor substrate outside the predetermined area. Then, a stress produced during breaking is concentrated, for example, at an edge portion of the predetermined area of the semiconductor substrate. This results in the occurrence of cracking or the like and accordingly lowers a yield rate, which has been a problem.

SUMMARY OF THE INVENTION

It is an object of the invention to provide a method and apparatus for breaking a semiconductor substrate, which can prevent the occurrence of cracking or the like due to stress concentration at a portion of the semiconductor substrate that is caused when the semiconductor substrate is broken along a predetermined area over which a split groove is formed, a method of breaking a solar cell utilizing the above method or apparatus, and a method for fabrication of a solar cell module.

The method for breaking a semiconductor substrate, in accordance with the present invention, is a method in which a semiconductor substrate is broken along a predetermined area over which a split groove is formed, and is characterized as including the steps of holding the semiconductor substrate in position and pressing a portion of the semiconductor substrate outside the predetermined area to break the semiconductor substrate along the split groove, wherein the predetermined area has at least a neighboring pair of sides intersecting at an angle of less than 180 degrees and, when the semiconductor substrate is broken, one of the sides is pressed ahead of the other side.

In the present invention, the predetermined area of the semiconductor substrate has at least a neighboring pair of sides intersecting at an angle of less than 180 degrees. Each of the neighboring pair of sides may not be necessarily linear and may include a curve. They just need to intersect at an angle of less than 180 degrees. The reason why the intersecting angle is specified in the present invention as being less than 180 degrees is because a stress tends to concentrate at an edge portion where the two sides intersect at such an angle.

In the present invention, one of such pair of sides is compressed ahead of the other in breaking the semiconductor substrate. This suppresses stress concentration at an edge portion defined by the pair of sides and accordingly prevents the occurrence of cracking or the like.

That is, simultaneous application of a pressing force on the pair of sides, as conventionally practiced, causes stress concentration at the edge portion defined by the pair of sides and increases the occurrence of cracking or the like at such a portion. In the present invention, one side is compressed ahead of the other side. Accordingly, a stress is first exerted on the one side in its entirety so that breaking starts to occur along a scribed portion running over the one side. Subsequently, the stress is exerted on the other side in its entirety so that breaking starts to occur in the other side. The practice of such multistage breaking suppresses stress concentration at the edge portion where the one side meets with the other side and thus prevents the occurrence of cracking or the like.

In the preferred embodiment according to the method of the present invention for breaking a semiconductor substrate, the portion of the semiconductor substrate inside the predetermined area is placed on a table. Thereafter, a breaking blade, located above the semiconductor substrate on the table, is moved downward to compress the portion of the semiconductor substrate outside the predetermined area so that the semiconductor substrate is broken along the split groove.

The apparatus of the present invention for breaking a semiconductor substrate is an apparatus which utilizes the aforementioned method of the present invention to break the semiconductor substrate along the predetermined area over which the split groove is formed. The apparatus includes a table for placement of the portion of the semiconductor substrate inside the predetermined area and a breaking blade operable to move downward from a position above the semiconductor substrate placed on the table and compress the portion of the semiconductor substrate outside the predetermined area so that the semiconductor substrate is broken along the split groove. Characteristically, the predetermined area of the semiconductor substrate has at least a neighboring pair of sides intersecting at an angle of less than 180 degrees, and the breaking blade has a projection which, in breaking the semiconductor substrate, compresses a portion of the semiconductor substrate outside the one side so that the one side is compressed ahead of the other side.

In the breaking apparatus of the present invention, the breaking blade has a projection which, when the semiconductor substrate is broken, compresses a portion of the semiconductor substrate outside the one side so that the one side is compressed ahead of the other side, as described above. By the action of the projection of the breaking blade, the one side is compressed ahead of the other side. This suppresses stress concentration at the edge portion where the one side meets the other side and prevents the occurrence of cracking or the like, as similar to the breaking method of the present invention.

Preferably, the breaking apparatus of the present invention further includes a press member for pressing the portion of the semiconductor substrate inside the predetermined area against the table from above so that the semiconductor substrate is held firmly in position when it is broken. The provision of the press member makes it easy to firmly hold the semiconductor substrate placed on the table in position.

In the present invention, a shape of the predetermined area defined by the split groove formed on the semiconductor substrate may be ring-like or linear such as a straight or curved line. In the case where the semiconductor substrate is broken into a ring-like shape by separating its circumferential portion as an undivided whole, a shape of the predetermined region defined by the split groove is ring-like. When the semiconductor substrate is broken along such a ring-shaped predetermined area, the breaking blade used is generally ring-shaped. In the case where the ring-shaped breaking blade is used, it preferably has a hole of a size that allows the table to pass therethrough.

In the breaking apparatus of the present invention, an inner end face of the projection preferably has a taper that extends downwardly and outwardly. The provision of such a taper allows smooth bending of the portion of the semiconductor substrate outside the predetermined area, leading to breaking thereof along the split groove.

Also in the present invention, a portion of the breaking blade that lacks the projection and exerts a pressure on the portion of the semiconductor substrate outside the predetermined area preferably has a taper which extends downwardly outwardly. The provision of such a taper allows smooth bending of the semiconductor substrate portion outside the predetermined area, leading to breaking thereof along the split groove.

In the breaking apparatus of the present invention, the height of the projection is not particularly specified, but is generally preferably in the range of 0.5-50 mm, more preferably in the range of 1-10 mm.

In the breaking apparatus of the present invention, the breaking blade, because of provision of the projections, has portions lacking the projection and those having the projection and can thus compress the semiconductor substrate by at least two stages. The projections may have different heights. In that case, the breaking blade can compress the semiconductor substrate by three or more stages, leading to breaking thereof.

The breaking method and apparatus of the present invention is useful in removing a peripheral portion of a semiconductor substrate in the fabrication of a solar cell or in dividing a large-area semiconductor substrate into individual small-area solar cells. Accordingly, a semiconductor substrate having solar cell element structures formed thereon can be illustrated as one form of the semiconductor substrate for use in the present invention.

According to the method of the present invention for fabrication of a solar cell module, a semiconductor substrate is broken using the breaking method or apparatus of the present invention. Therefore, the occurrence of cracking in breaking the semiconductor substrate can be prevented. As a result, a solar cell module can be fabricated with a good yield rate.

The present invention can prevent the occurrence of cracking or the like due to stress concentration at a portion of the semiconductor substrate that is caused when the semiconductor substrate is broken along the predetermined area over which the split groove is formed.

DESCRIPTION OF PREFERRED EMBODIMENTS

Figure 1:
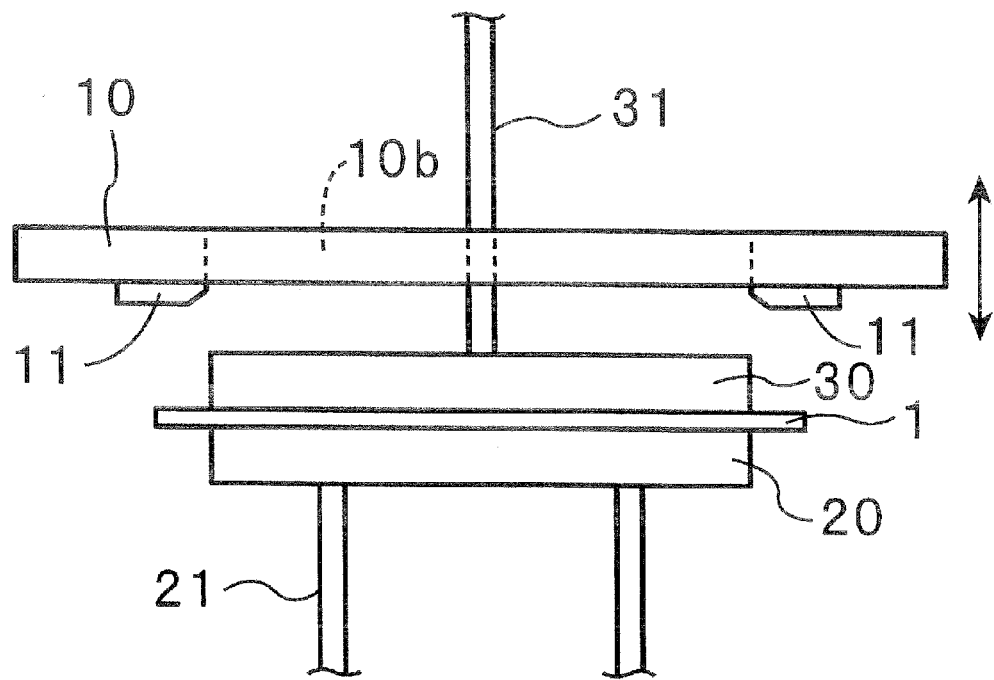
FIG. 1 is a side view, showing an embodiment of a breaking apparatus in accordance with the present invention.

FIG. 1 is a side view which shows an embodiment of an apparatus for breaking a semiconductor substrate in accordance with the present invention.

Referring to FIG. 1, a semiconductor substrate 1 is placed on a table 20 and held in position by a press member 30 which is supported from above by a rod 31 and compresses the substrate against the table 20. The table 20 is supported from below by rods 21. The method by which the semiconductor substrate is held in position is not limited thereto.

Located above the semiconductor substrate 1 is a breaking blade 11. The breaking blade 10 is ring-shaped and has an interior central hole 10b which is sized to allow passage of the press member 30 and the table 20. A projection forming member 11 is attached to an inner portion of a lower face of the ring-shaped breaking blade 10. Although not shown, the breaking blade 10 is supported from above by rods for vertical movement.

Figure 2:
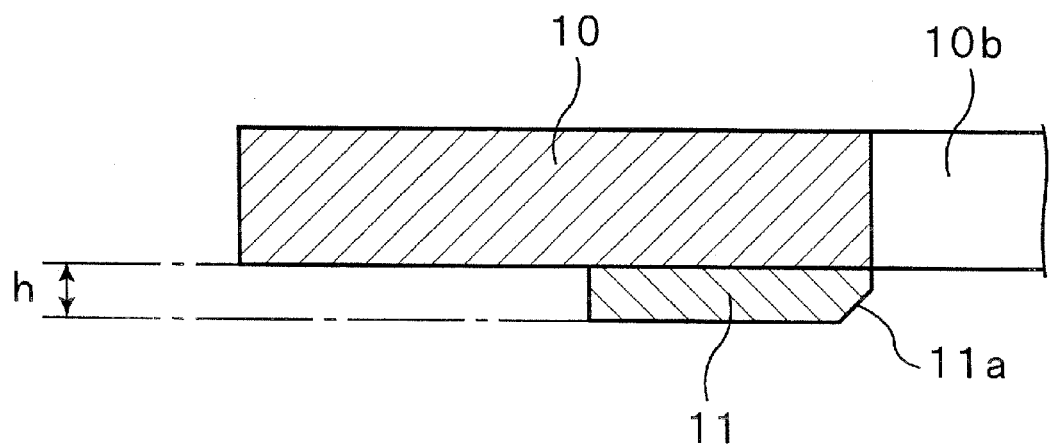
FIG. 2 is an enlarged sectional view, showing a breaking blade portion to which a projection forming member is mounted.
Figure 3:
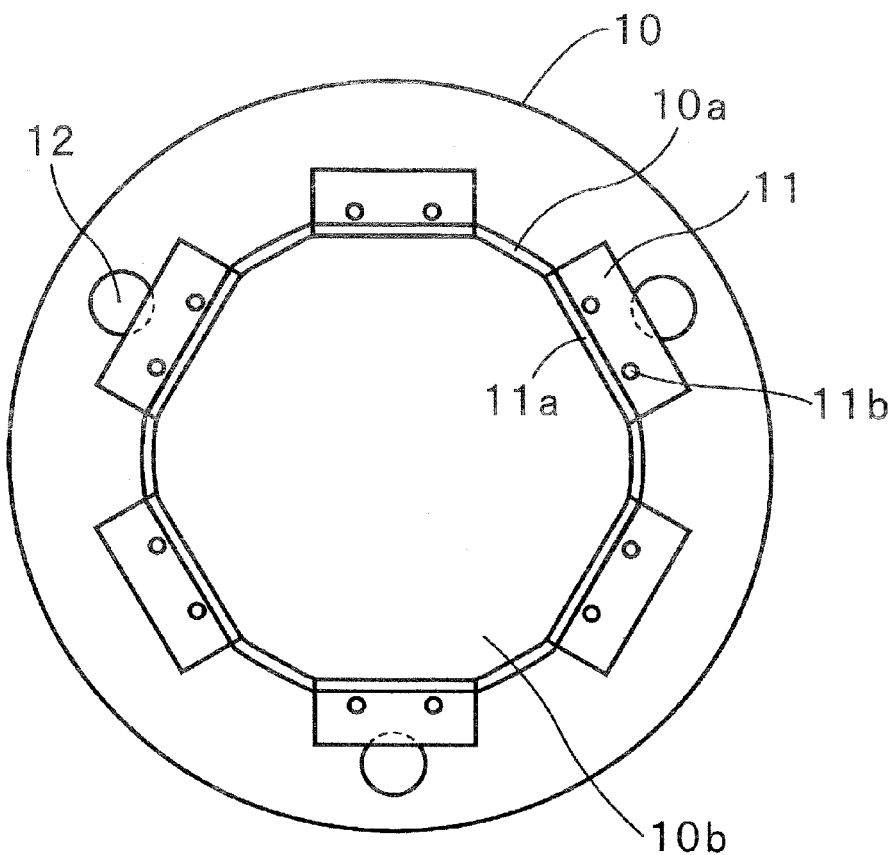
FIG. 3 is a plain view, showing a breaking blade in the embodiment shown in FIG. 1, when viewed from below.

FIG. 2 is an enlarged sectional view which shows the breaking blade 10 and the projection forming member 11. FIG. 3 is a plan view which shows a lower face of the breaking blade 10. As shown in FIGS. 2 and 3, an inner end face of the projection forming member 11 has a taper 11a which extends downwardly and outwardly.

As shown in FIG. 3, the interior hole 10a of the breaking blade 10 has a generally dodecagonal shape. The projection forming member 11 is mounted to every other side and accordingly to six sides in total. An inner end surface of the breaking blade, where the projection forming members 11 are not mounted, has a taper 10a at its lower portion. This taper 10a is configured to extend downwardly and outwardly, as similar to the taper 11a of the projection forming member 11.

The breaking blade 10 has circumferentially arranged three holes 12 for passage of rods which together support the breaking blade from above.

As described above, the central hole 10b of the breaking blade 10 has a generally dodecagonal shape. The one side to which the projection forming member 11 is mounted and the adjacent side to which the projection forming member 11 is not mounted intersect at an angle of less than 180 degrees. In this embodiment, the neighboring pair of sides are shown to intersect at an angle of about 160 degrees. Although the side to which the projection forming member 11 is not mounted appears somewhat rounded, its end portions meet the respective adjacent sides each contiguous with an inner end of the projection forming member 11 at an angle of less than 180 degrees, as specified in the present invention.

The height of the projection forming member 11, that is, the height h of the projection in this embodiment, as shown in FIG. 2, is 3 mm. The height of the projection in the present invention can be suitably set up considering a rate of movement of the breaking blade and others. However, it is generally preferably in the range of 1-10 mm, as described above.

Figure 4:
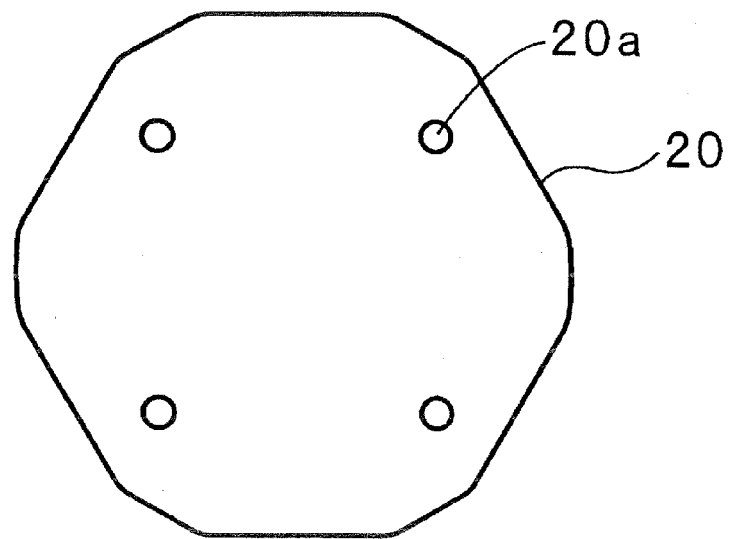
FIG. 4 is a plan view, showing a table in the embodiment shown in FIG. 1.

FIG. 4 is plan view which shows the table 20. As shown in FIG. 4, the table is sized to pass through the hole 10b of the breaking blade 10 and has a shape analogous to that of the hole 10b. Preferably, the respective shapes of the hole 10b of the breaking blade 10 and the table 20 nearly correspond to the shape of the predetermined area along which the split groove is formed in the semiconductor substrate.

The table 20 has a central hole 20a for passage of the rods 21 shown in FIG. 1 for supporting the table 20.

Figure 5:
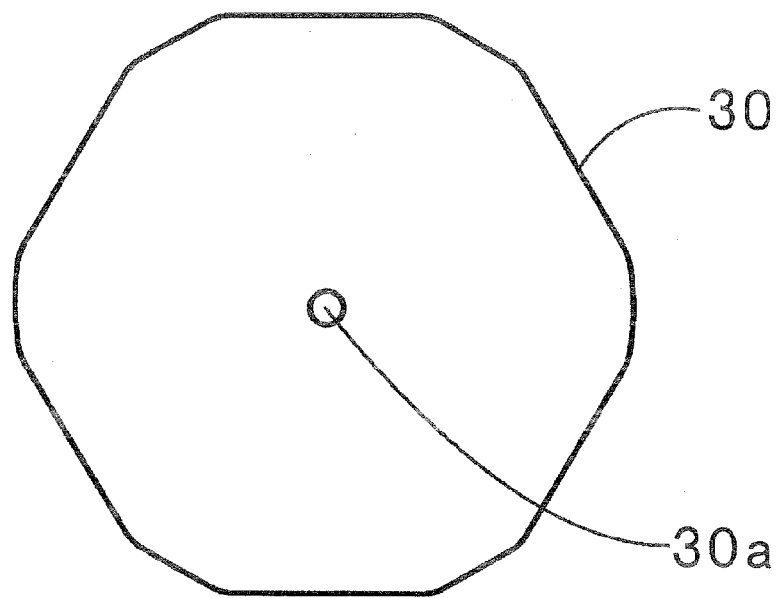
FIG. 5 is a plain view, showing a press member in the embodiment shown in FIG. 1.

FIG. 5 is a plan view which shows the press member 30 shown in FIG. 1. Preferably, the press member 30 is also sized to pass through the hole 10a of the breaking blade 10 and has a shape contiguous to that of the hole 10a.

Although the breaking blade 10, projection forming member 11 and table 20 are not particularly specified immaterial type, they are all made of stainless steel in this embodiment. Also, the material type of the press member shown in FIG. 5 is not particularly specified. However, in this embodiment, it is formed of an engineering plastic or other plastic member.

Also, the respective material types of the rods for supporting the breaking blade 10, table 20 and press member 30 are not particularly specified. However, they are all made of stainless steel in this embodiment.

Figure 6:
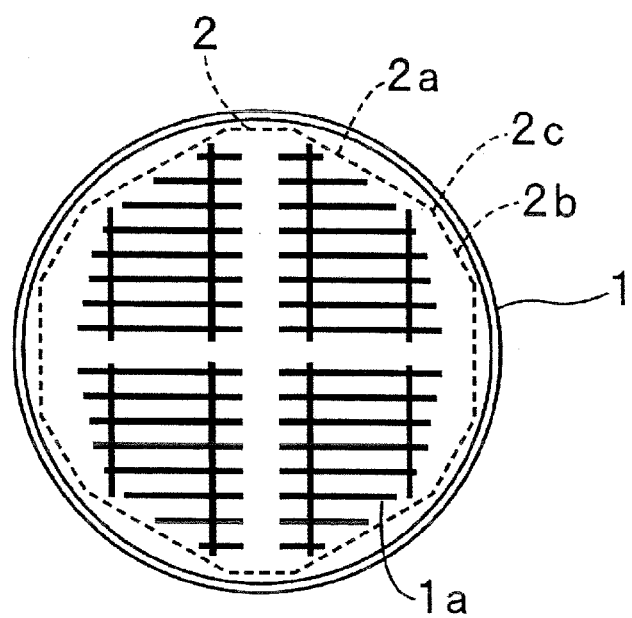
FIG. 6 is a plain view, showing a solar cell before subjected to breaking.

FIG. 6 is a plan view which shows the semiconductor substrate 1 as it is used in a solar cell. The solar cell 1 has a current collecting electrode 1a and a ring-shaped predetermined area 2 extending along its outer periphery.

Figure 8:
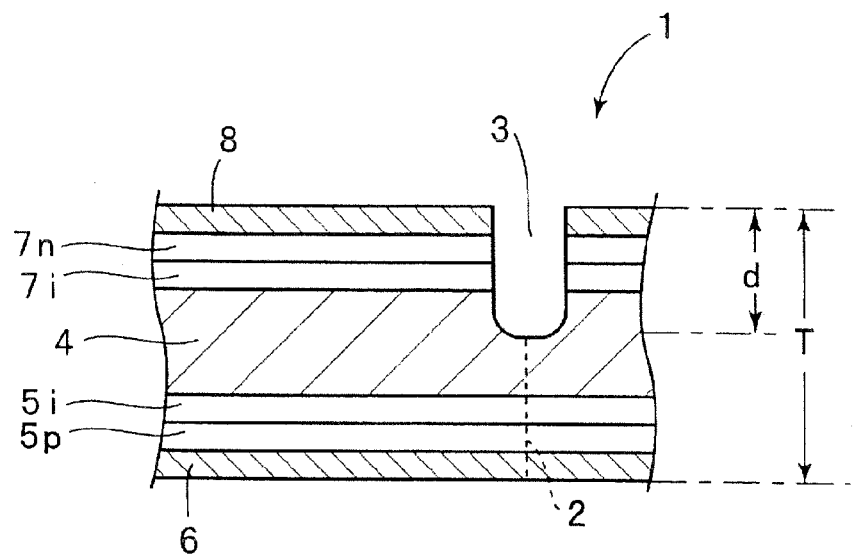
FIG. 8 is a partly enlarged sectional view, showing a predetermined area of a solar cell over which a split groove is formed.

FIG. 8 is an enlarged sectional area which shows the predetermined area 2 in the solar cell 1 and its surroundings. A split groove 3 is formed over the predetermined area 2 in the solar cell 1. The split groove 3 can be formed, for example, by irradiating the solar cell with an energy beam such as a laser beam. Examples of useful lasers include a YAG laser, gas lasers such as a $CO_2$ laser, KrF laser, ArF laser and XeCl laser, and solid lasers such as an YVO4 laser. Although not particularly specified, the depth d of the split groove 3 is preferably 35-70% of the thickness T of the solar cell (semiconductor substrate) 1.

In the solar cell 1 shown in FIG. 8, its lower surface constitutes a primary light-receiving surface. Deposited on a lower surface of an n-type single crystal silicon substrate 4 is an i-type amorphous silicon layer 5i (about 5 nm-about 20 nm thick) on which a p-type amorphous silicon layer 5p (about 5 nm-about 20 nm thick) is deposited. These constitute a semiconductor junction region which is a pin junction. A transparent electroconductive film 6 (about 30 nm-about 150 nm thick) such as of ITO (indium tin oxide) is deposited on the p-type amorphous silicon layer 5p.

An i-type amorphous silicon layer 7i (about 5 nm-about 20 nm thick) and an n-type amorphous silicon layer 7n (about 5 nm-about 20 nm thick) are sequentially stacked on an upper surface of the n-type single crystal silicon substrate 4. A transparent electroconductive film 8 (about 30 nm-about 150 nm thick) is formed on the n-type amorphous silicon layer 7n.

In the above solar cell, a pn junction is formed between the n-type single crystal silicon substrate 4 and the p-type amorphous silicon layer 5p. Inserted into the junction interface is the i-type amorphous silicon layer Si having a level of thickness that does not contribute to power generation.

In this embodiment, the n-type single crystal silicon substrate is used. Alternatively, a p-type single crystal silicon substrate may be used. In such a case, an i-type amorphous silicon layer and an n-type amorphous silicon layer may be deposited on a lower surface of the substrate, and an i-type amorphous silicon layer and a p-type amorphous silicon layer may be deposited on an upper surface of the substrate. Alternatively, a surface of an n-type or p-type crystalline semiconductor substrate may be doped with a p-type or n-type dopant to form a pn junction for a solar cell. The present invention is also applicable to semiconductor substrates other than the solar cell.

Referring to FIG. 6, the predetermined area 2 in the solar cell 1 is defined by the split groove 3 shown in FIG. 8.

Referring to FIG. 1, the solar cell 1 is placed on the table 20 such that a portion of the solar cell 1 inside the predetermined area 2 is positioned over the table. The press member 30 is then moved to ride on the predetermined area 2 in the solar cell 1 and compresses the solar cell 1 downward so that the solar cell 1 is held firmly in position.

Referring to FIG. 1, the breaking blade 10 is then moved downward. During its downward movement, the press member 30 is allowed to pass through the hole 10b. Subsequently, the projection forming member 11 mounted to the lower face of the breaking blade 10 is brought into contact with a portion of the solar cell that extends outwardly from the table 20 and press member 30.

Figure 9:
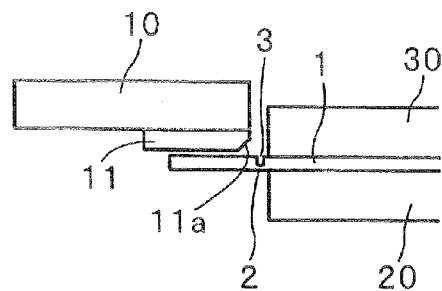
FIG. 9 is a partly enlarged sectional views showing a portion of the solar cell outside the predetermined area in the embodiment shown in FIG. 1, while in the process of being broken.
Figure 9:
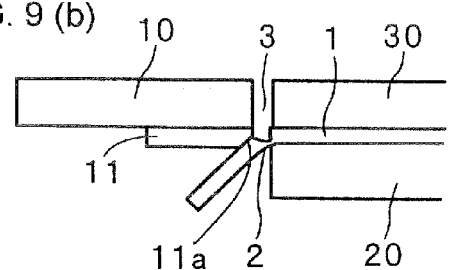
Figure 9:
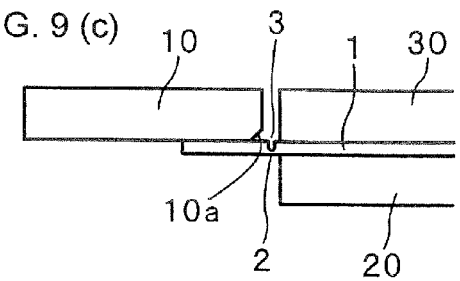
Figure 9:
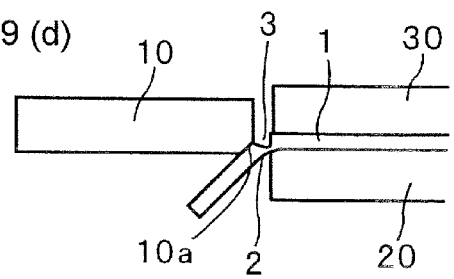

FIG. 9 is a sectional view which shows the solar cell 1 in the process of being broken by the breaking blade along the predetermined area 3 over which the split groove 3 is formed.

As shown in FIG. 9(a), as the breaking blade 10 moves downward, the projection forming members 11 mounted to the lower face of the breaking blade 10 first contact with the corresponding portions of the solar cell 1 outside the predetermined area 2.

As the breaking blade 10 further moves downward, such portions of the solar cell 1 outside the predetermined area 2 are pushed downward and bent to start breaking along the split groove 3, as shown in FIG. 9(b).

At this point, the remaining portions of the solar cell 1 outside the predetermined area have not been pushed downward yet and remain unbroken, as shown in FIG. 9(c), because the breaking blade does not carry the projection forming members 11 in the corresponding portions.

As the breaking blade further moves downward, such remaining portions of the solar cell 1 outside the predetermined area 2 are also pushed downward and bent to start breaking along the split groove 3, as shown in FIG. 9(d).

As described above, in this embodiment, the portions of the breaking blade that mount the projection forming members 11 start to break the corresponding portions of the solar cell along the split groove 3. Thereafter, the remaining portions of the breaking blade that do not mount the projection forming members 11 start to break the corresponding portions of the solar cell along the split groove 3. As such, a stress is exerted on one side of a neighboring pair of sides in the predetermined area to achieve breaking. Subsequently, a stress is exerted on the other side to achieve breaking. This suppresses stress concentration that occurs at an edge portion of the pair of sides when a stress is simultaneously exerted on both sides. Thus, the present invention can prevent cracking that occurs when the semiconductor substrate is broken along the split groove.

Figure 7:
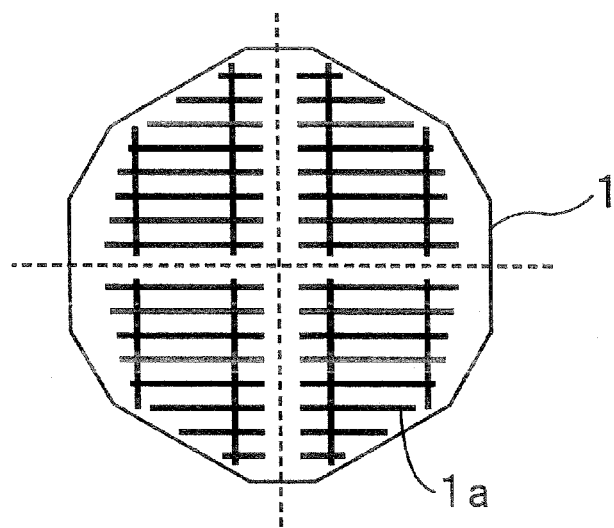
FIG. 7 is a plain view, showing a solar cell after broken.

FIG. 7 is a plan view which shows the configuration of the solar cell 1 after broken along the predetermined area 2 and separated from the peripheral portion. After removal of the peripheral useless portion, the solar cell 1 is further divided along planes shown by dotted lines in FIG. 7. In this case, division is achieved by forming split grooves over such planes in the same manner as described above and then bending and breaking the substrate along the split grooves. Since the substrate is broken along linear lines, the multi-stage application of a stress is not required for the breaking. A sequence of breaking is not particularly specified. For example, the solar cell can be first broken along the longitudinally split groove into two individual solar cells. Each individual solar cell can be further bent and broken along the laterally split groove.

Figure 10:
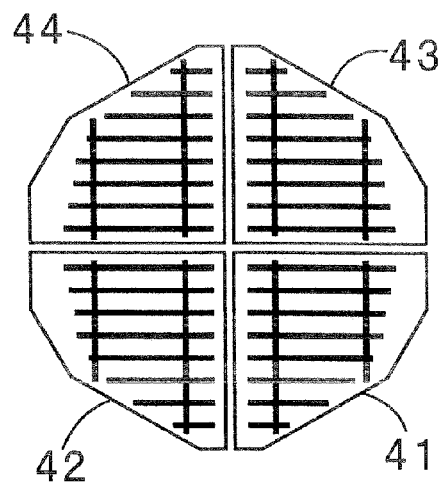
FIG. 10 is a plan view, showing solar cells after divided along dotted lines shown in FIG. 7.
Figure 11:
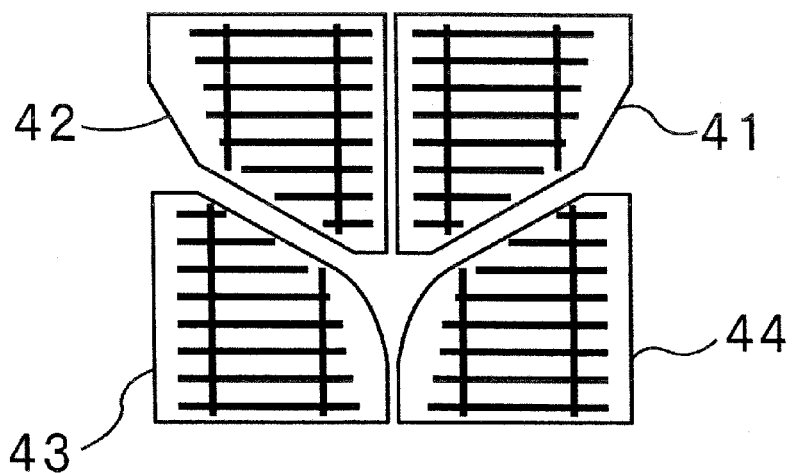
FIG. 11 is a plan view, showing an exemplary arrangement of solar cells of FIG. 10 obtained after division.

FIG. 10 is a plan view which shows the individual solar cells after division. As shown in FIG. 10, the solar cell is divided into four individual small-area solar cells 41, 42, 43 and 44. The solar cells 41-44 such divided can be arranged, for example, in the fashion as shown in 11 and connected in series by a tab or the like soldered thereto, resulting in the fabrication of a solar cell module.

Breaking of the solar cell is preferably carried out subsequent to formation of a pn junction in the semiconductor substrate. Because there is a possibility that breaking leaves a minute defect on a broken surface of the semiconductor substrate, if the pn junction is formed after the breaking, an yielding rate or performance characteristics of the solar cell may decrease or deteriorate. In order to avoid such disadvantages, a breaking process is preferably performed after formation of the pn junction.

Figure 12:
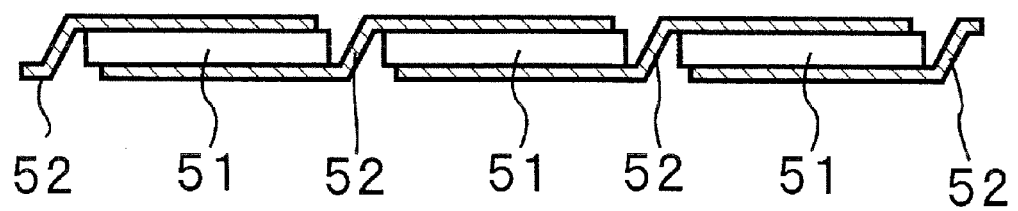
FIG. 12 is a schematic sectional view, showing solar cells connected in series by tabs.

FIG. 12 is a sectional view shows plural solar cells connected in series by tabs. As shown in FIG. 12, they can be connected in series by connecting an upper-surface electrode of a solar cell 51 to a lower-surface electrode of a neighboring solar cell 51 by a tab 52.

Figure 13:
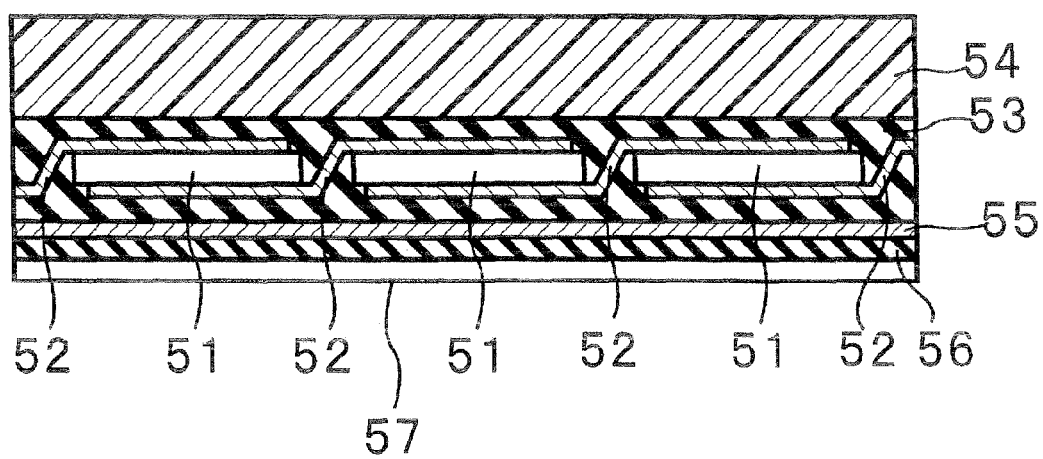
FIG. 13 is a sectional view, showing an embodiment of a solar cell module as fabricated in accordance with the present invention.

FIG. 13 is a sectional view which shows a structure of a solar cell module using the solar cells connected in series as shown in FIG. 12. As shown in FIG. 13, in a solar cell module, plural solar cells 51 are connected in series through tabs 52. The solar cells 51 connected in such a fashion by the tabs 52 are sealed, for example, by a filler 53 consisting of an EVA (ethylene vinyl acetate) resin. A surface-protecting member 54, made of a surface-protecting transparent glass, is provided to overlie an upper surface (incidence plane side) of the filler 53. Also, a surface-protecting member 57, made up of a sequence of a PET (polyethylene terephthalate) film, an aluminum foil and a PET film, for example, is provided to underlie a lower surface of the filler 53. Reference numeral 55 indicates a PET film for enhancing a pressure resistance of the solar cell.

As described above, after removal of the peripheral useless portion, the large-area solar cell is divided into small-area solar cells which are subsequently arranged and electrically connected to fabricate a solar cell module. In the fabrication of the solar cell module, the utilization of the present invention can prevent cracking or the like that occurs when the large-area peripheral portion is removed by breaking and also reduce the incidence of defects.

In the above embodiment, the projection forming members mounted to the breaking blade are shown to have the same height. With the projections of the same height, a stress is applied to the substrate by two stages to break it along the split groove. However, the present invention is not limited thereto. For example, those projections may have different heights. In such a case, breaking is achieved by applying a stress to the substrate by three or more stages.

Also, in the above embodiment, the projections are provided by the projection forming members mounted to the breaking blade. However, the present invention is not limited thereto. Those projections may be integrally formed with the breaking blade. In such a case, they may be formed by cutting the breaking blade, for example.

Also, in the above embodiment, the ring-shaped breaking blade is used to break the semiconductor substrate along the ring-shaped predetermined area which extends circumferentially of the substrate. However, the present invention is not limited thereto. The present invention can also be applied to the case where the semiconductor substrate is broken along a non-ring or linear predetermined area.

Also, the breaking method of the present invention can be carried out using the other apparatus. For example, in FIG. 3, a first breaking blade may be disposed in the location of each projection forming member 11, a second breaking blade in the location between neighboring projection forming members 11, 11, and the first and second breaking blades may be operated with a time delay in the performance of breaking.

Also, in the above embodiment, the solar cell is described as an example of the semiconductor substrate. However, the present invention is also applicable in breaking a semiconductor substrate other than the solar cell.

What is claimed is:

1. A method for breaking a semiconductor substrate along a predetermined area over which a split groove is formed, comprising the steps of:
   holding said semiconductor substrate in position; and
   compressing a portion of the semiconductor substrate outside the predetermined area with a breaking blade to break the semiconductor substrate along said split groove;
   wherein said predetermined area has at least a neighboring pair of sides intersecting at an angle of less than 180 degrees and, in breaking the semiconductor substrate, one of said pair of sides is compressed ahead of the other side and then the other side is compressed, and wherein both said one side and the other side are compressed during the same one-time movement of said breaking blade.

2. The method for breaking a semiconductor substrate as recited in claim 1, wherein, subsequent to placement of a portion of the semiconductor substrate inside the predetermined area on a table, a breaking blade located above the semiconductor substrate is moved downward to compress the portion of the semiconductor substrate outside the predetermined area so that the semiconductor substrate is broken along the split groove.

3. A method for breaking a solar cell comprising the steps of:
   forming a pn junction on a semiconductor substrate of one conductive type;
   forming a split groove in said semiconductor substrate; and
   breaking the semiconductor substrate with a breaking blade along a predetermined area over which said split groove is formed;
   wherein said predetermined area of the semiconductor substrate has at least a neighboring pair of sides intersecting at an angle of less than 180 degrees and, in breaking the semiconductor substrate, one side is compressed ahead of the other side and then the other side is compressed, and wherein both said one side and the other side are compressed during the same one-time movement of said breaking blade.

4. The method for breaking a solar cell as recited in claim 3, wherein, subsequent to forming said pn junction on the semiconductor substrate, the semiconductor substrate is broken.

5. A method for fabrication of a solar cell module comprising the steps of:
  providing a semiconductor substrate having a solar cell element structure formed thereon;
  dividing said semiconductor substrate using the method recited in claim 1; and
  arranging plural semiconductor substrates after division and electrically connecting them to thereby fabricate a solar cell module.

6. A method for fabrication of a solar cell module comprising the steps of:
  providing a semiconductor substrate having a solar cell element structure formed thereon;
  dividing said semiconductor substrate using the method recited in claim 3; and
  arranging plural semiconductor substrates after division and electrically connecting them to thereby fabricate a solar cell module.

7. A method for fabrication of a solar cell module comprising the steps of:
  providing a semiconductor substrate having a solar cell element structure formed thereon;
  dividing said semiconductor substrate using an apparatus comprising:
    a table for placement of a portion of said semiconductor substrate inside said predetermined area; and
    a breaking blade being operable to move downward from a position above the semiconductor substrate placed on the table to thereby compress the portion of the semiconductor substrate outside the predetermined area so that the semiconductor substrate is broken along the split groove;
    wherein the predetermined area of the semiconductor substrate has at least a neighboring pair of sides intersecting at an angle of less than 180 degrees, and said breaking blade has a projection which, in breaking the semiconductor substrate, compresses a portion of the semiconductor substrate outside the one side so that the one side is compressed ahead of the other side during the same one-time movement of said breaking blade; and
  arranging plural semiconductor substrates after division and electrically connecting them to thereby fabricate a solar cell module.

8. The method for breaking a semiconductor substrate as recited in claim 1, wherein a projections forming member is provided on said breaking blade.

9. The method for breaking a semiconductor substrate as recited in claim 8, wherein said breaking blade has a first area in which said projection forming member is provided and a second area in which said projection forming member is not provided.

10. A method for breaking a semiconductor substrate along a predetermined area over which a split groove is formed, comprising the steps of:
  holding said semiconductor substrate in position; and
  compressing a portion of the semiconductor substrate outside the predetermined area with a breaking blade to break the semiconductor substrate along said split groove;
  wherein said predetermined area has at least a neighboring pair of sides intersecting at an angle of less than 180 degrees and, in breaking the semiconductor substrate, one of said pair of side is compressed ahead of the other side, and wherein said one side is still compressed when starting compressing the other side.

11. The method for breaking a semiconductor substrate as recited in claim 10, wherein said breaking is achieved by applying a stress to the semiconductor substrate by two or more stages.

12. The method for breaking a semiconductor substrate as recited in claim 10, wherein said breaking blade is ring-shaped.

13. The method for breaking a semiconductor substrate as recited in claim 10, wherein a projection forming member is provided on said breaking blade.

14. The method for breaking a semiconductor substrate as recited in claim 10, wherein said breaking blade has a dodecagonal shape.

15. The method for breaking semiconductor substrate as recited in claim 10, wherein said breaking blade comprises a plurality of blades.

* * * * *